(12) United States Patent
McBride

(10) Patent No.: US 7,807,509 B2
(45) Date of Patent: Oct. 5, 2010

(54) ANODICALLY BONDED ULTRA-HIGH-VACUUM CELL

(75) Inventor: Sterling Eduardo McBride, Princeton, NJ (US)

(73) Assignee: Sarnoff Corporation, Princeton, NJ (US)

( * ) Notice: Subject to any disclaimer, the term of this patent is extended or adjusted under 35 U.S.C. 154(b) by 208 days.

(21) Appl. No.: 12/258,495

(22) Filed: Oct. 27, 2008

(65) Prior Publication Data

US 2009/0095414 A1    Apr. 16, 2009

Related U.S. Application Data

(62) Division of application No. 11/433,930, filed on May 15, 2006, now Pat. No. 7,470,971.

(51) Int. Cl.
    *H01L 21/44* (2006.01)
(52) U.S. Cl. ............... 438/118; 438/660; 257/E21.333
(58) Field of Classification Search ............. 438/118, 438/660; 257/E21.333
    See application file for complete search history.

(56) References Cited

U.S. PATENT DOCUMENTS

| | | | |
|---|---|---|---|
| 4,617,606 A | 10/1986 | Shak et al. | |
| 4,625,561 A | 12/1986 | Mikkor | |
| 4,701,826 A | 10/1987 | Mikkor | |
| 4,773,972 A | 9/1988 | Mikkor | |
| 4,849,374 A | 7/1989 | Chen et al. | |
| 4,908,921 A | 3/1990 | Chen et al. | |
| 4,960,177 A | 10/1990 | Holm-Kennedy et al. | |
| 5,591,679 A | 1/1997 | Jakobsen et al. | |
| 5,705,070 A | 1/1998 | Saaski et al. | |
| 5,747,169 A | 5/1998 | Fan et al. | |
| 5,929,497 A | 7/1999 | Chavan et al. | |
| 6,467,354 B1 | 10/2002 | Allen | |
| 6,476,383 B1 * | 11/2002 | Esslinger et al. | ............. 250/251 |
| 6,661,637 B2 | 12/2003 | McIntosh et al. | |
| 6,803,570 B1 * | 10/2004 | Bryson et al. | ............... 250/305 |
| 6,811,916 B2 | 11/2004 | Mallari et al. | |
| 6,923,625 B2 | 8/2005 | Sparks | |
| 6,929,974 B2 | 8/2005 | Ding et al. | |
| 6,938,310 B2 | 9/2005 | Hawkins et al. | |
| 6,939,778 B2 | 9/2005 | Harpster et al. | |
| 7,008,855 B2 | 3/2006 | Baney et al. | |
| 7,045,868 B2 | 5/2006 | Ding et al. | |
| 7,126,112 B2 * | 10/2006 | Anderson et al. | ........... 250/251 |
| 7,204,737 B2 | 4/2007 | Ding et al. | |
| 7,254,249 B2 | 8/2007 | Rhoads et al. | |
| 7,378,294 B2 | 5/2008 | Ding et al. | |
| 2004/0255643 A1 | 12/2004 | Wise et al. | |
| 2007/0031961 A1 | 2/2007 | Ho et al. | |
| 2008/0047926 A1 | 2/2008 | Santini et al. | |
| 2010/0084284 A1 * | 4/2010 | Happer et al. | ............... 205/769 |

FOREIGN PATENT DOCUMENTS

EP    1344745    9/2003

* cited by examiner

*Primary Examiner*—Ngan Ngo
(74) *Attorney, Agent, or Firm*—Lowenstein Sandler PC

(57) ABSTRACT

The present invention discloses an anodically bonded vacuum cell structure with a glass substrate including a cavity, and a substrate deposited on the glass substrate, thereby enclosing the cavity to form a bonding interface. The bonding interface having silicon such that the substrate includes a layer of silicon or a secondary substrate with silicon layer bonded onto the secondary substrate.

12 Claims, 7 Drawing Sheets

ANODICALLY BONDED ULTRA-HIGH-VACUUM CELL

CROSS-REFERENCES

This application is a divisional of U.S. patent application Ser. No. 11/433,930 filed May 15, 2006, which claims priority of U.S. Provisional Application Ser. No. 60/680,695 filed May 13, 2005, entitled, "Anodically Bonded Ultra-High-Vacuum Cell". The entire disclosure of both these applications is incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. W911NF-04-I-0043 awarded by the Defense Advanced Research Projects Agency (DARPA) of the U.S. Department of Defense (DoD).

FIELD OF THE INVENTION

This invention generally relates to an anodic bonding structure, a fabricating method thereof, and more particularly to the anodic bonding assembly of different cell components.

BACKGROUND OF THE INVENTION

Anodic bonding is a well known technique of bonding a silicon substrate to a glass substrate having a thermal expansion coefficient similar to that of a silicon substrate. A conventional method to form an anodic bonding structure 10 is described with reference to FIG. 1. A silicon substrate 12 is deposited typically on a lower electrode 13a, preferably made of brass and includes cartridge heaters. A glass substrate 14 is aligned on top of the silicon substrate 1. The glass substrate such as a Pyrex glass, i.e., Corning glass 7740, is generally used in an anodic bonding process includes predetermined amounts of sodium (Na) and potassium (K) so that when the Pyrex glass is heated at a temperature of over 200° C., elements are charged and easily moved by a voltage. An upper electrode 13b, also made of brass with cartridge heaters, is bonded to the glass substrate 14 with a graphite electrode 15 as shown in FIG. 1. When the silicon substrate 12 and the glass substrate 14 are aligned as shown, the two substrates are heated at a temperature of about 425° C. to form a bond between the silicon substrate 12 and the glass substrate 14. The substrates are heated via the upper and the lower electrodes 13a and 13b respectively. Then, a voltage of about 1 KV is applied for approximately two minutes to the substrates via a DC power supply 16, causing movable charges to move rapidly. Thus, strong dielectric charges occur on the interfaces of the silicon substrate 12 and the glass substrate 14 to initiate and complete the formation of the bond of the silicon substrate 12 with the glass substrate 14. A force 17 is applied to the structure 10 using any means such as the pneumatic piston or a spring loaded system. As shown in FIG. 1, the lower electrode 13a is preferably placed on a ceramic brick 18. The brick 18 provides thermal insulation between the electrode 13a (heater) and a base or table (not shown) where the bonding apparatus is positioned. A plurality of microelectromechanical systems (MEMS) processes use an anodic bonding method that realizes a stable silicon structure.

U.S. Pat. No. 5,747,169 discloses a method of bonding a glass substrate and a nonconductive substrate using a field-assist bonding material preferably a non-doped silicon at low temperatures.

SUMMARY OF THE INVENTION

The present invention provides an anodically bonded vacuum cell structure/assembly comprising a glass substrate having a cavity, and a substrate deposited on the glass substrate thereby enclosing the cavity to form a bonding interface. The bonding interface having silicon such that the substrate includes a layer of silicon or a secondary substrate with silicon layer deposited on the secondary substrate.

The present invention also provides a method for fabricating a vacuum glass cell using anodic bonding technique, in which a body of the cell is bonded onto a substrate at a cavity or opening of the cell. The method comprising positioning a substrate on a first electrode, and aligning the body of the cell on top of the substrate, thereby enclosing the cavity to form a bonding interface. Such interface comprises silicon. The method also comprises applying pressure to hold the cell on the substrate, attaching a second electrode around the body of the cell and heating the substrate and the cell body via at least one of the first and second electrodes. The method further comprises applying voltage between the first and second electrodes to form a bond between the cell body and the substrate.

DETAILED DESCRIPTION OF THE INVENTION

The present invention relates generally to the anodic bonding for the assembly of the different cell components. More specifically to the fabrication of an ultra-high-vacuum (UHV) cell using the anodic bonding technique of the present invention.

Figure 1:
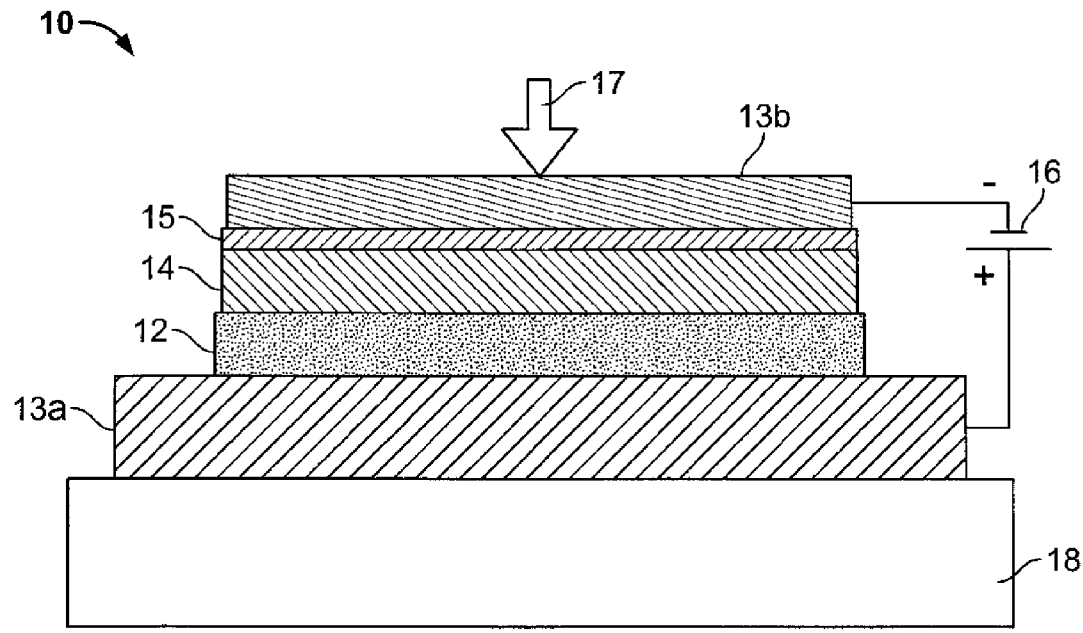
FIG. 1 illustrates a sectional view of a conventional anodic bonding structure.
Figure 2A:
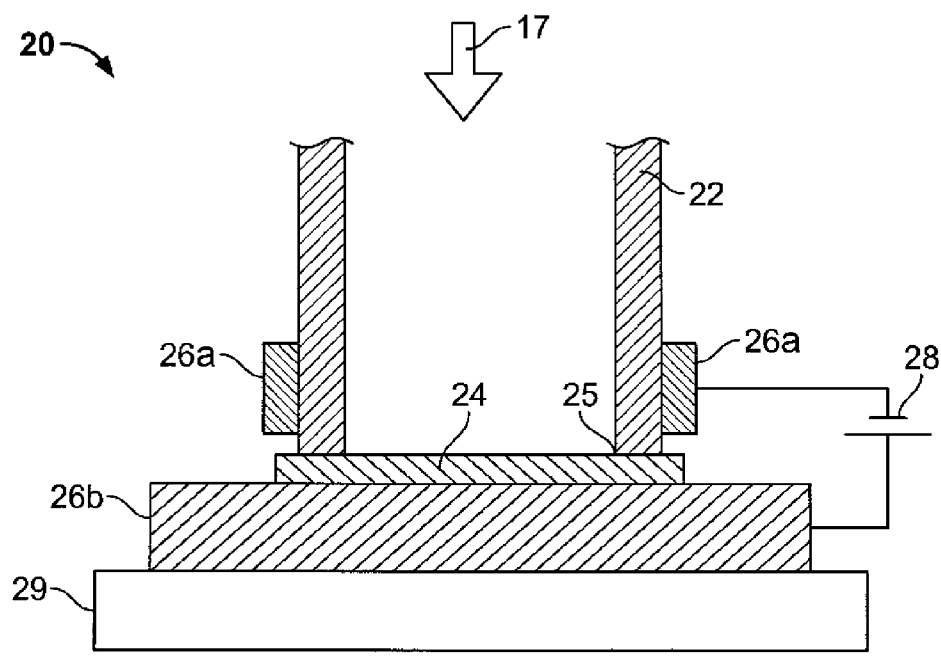
FIG. 2A illustrates a sectional view of an anodic bonding structure according to one embodiment of the present invention.

Now referring to FIG. 2A of the present invention, there is shown a sectional view of an anodic bonding structure or apparatus 20 in accordance with one embodiment of the present invention. As shown in FIG. 2A, an UHV glass cell 22, having an opening or cavity 23 is bonded on to a substrate 24 at a bonding interface 25. The substrate 24 is preferably made of a layer of silicon. It is important to note that the opening or cavity 23 could preferably have various shapes such as a square, circular, rectangular, oval or others shapes. As an example it could have a square cross-section with side dimensions ranging preferably from 2 mm to 50 mm. The wall thickness of the glass cell 22 ranges preferably from 0.5 mm to 20 mm. The thickness of the substrate 24 ranges preferably from 10 μm to 50 mm. The bonding interface 25 is defined as a common boundary between the glass cell 22 and the substrate. The cavity 23 of the glass cell is formed above the bonding interface 25. The substrate 24 is aligned with the glass cell 22 in such a way that it encloses the cavity 23 of the glass cell 22.

Figure 2B:
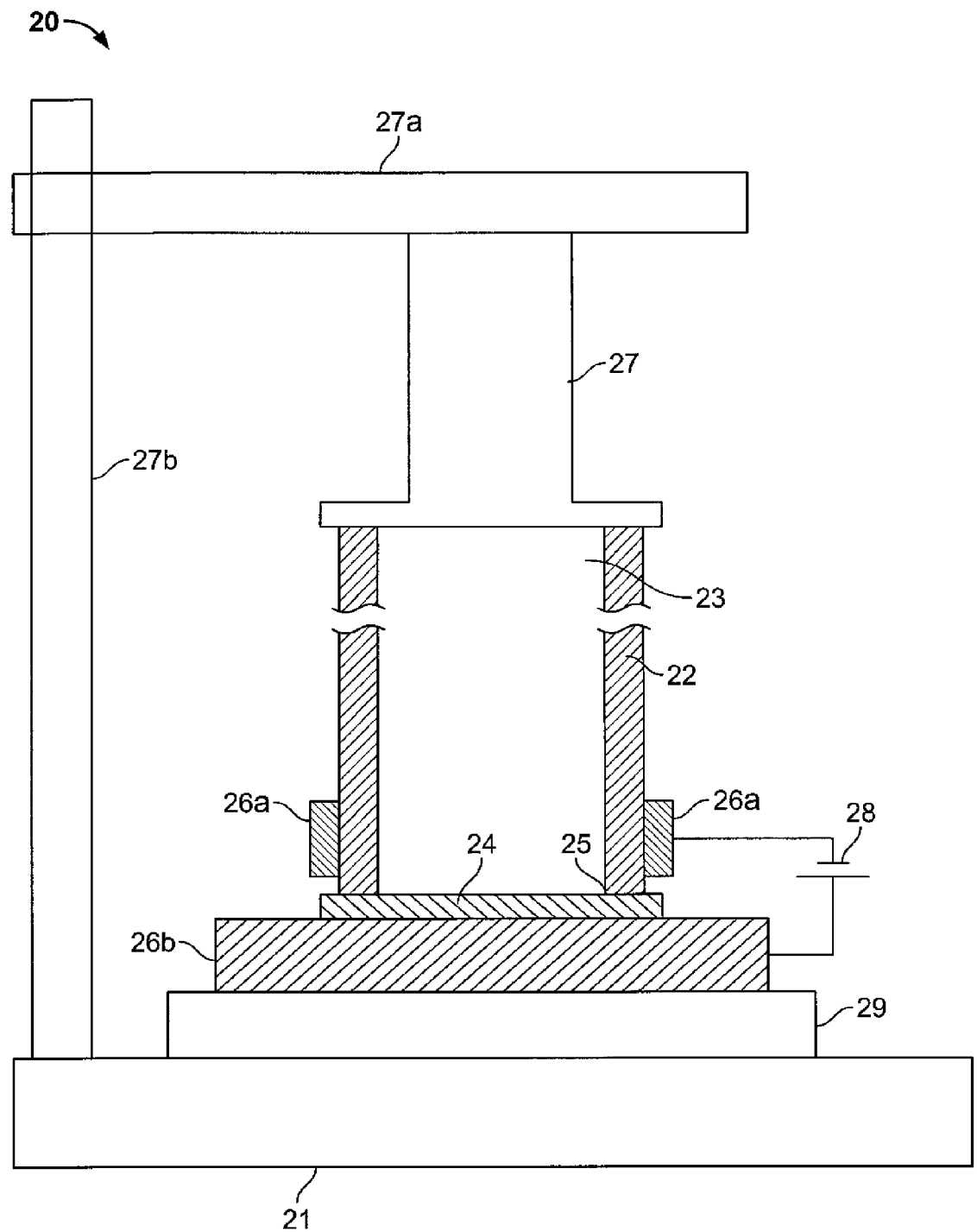
FIG. 2B illustrates a sectional view of an application of force on the bonding structure according to a preferred embodiment of the present invention.

A force or pressure 17 is applied to the structure 20 using any means to hold the glass cell 22 on the substrate 24. Referring to FIG. 2B, there is shown an application of such force into the structure 20 as a preferred embodiment of the present invention. Such means include applying a gas pressure ranging preferably from 1 psi to 30 psi into a pneumatic piston 27 that is attached to an arm 27a supported by a post 27b that is attached to a base 21 of the bonding apparatus 20. Another application of force can preferably be applied by a spring loaded system by replacing piston 27 with a spring, such means is well known in the art.

Returning back to FIG. 2A, there is shown a first electrode 26a attached around the glass cell 22 to provide heat to the cell 22. Moreover, there is a second electrode 26b on which the substrate 24 is positioned. The second electrode 26b provides heat to the substrate 24. The first and second electrodes 26a and 26b are preferably made of brass, copper, graphite. Both the substrate 24 and the glass cell 22 are heated via the first and/or second electrodes 26a and 26b to a temperature ranging preferably between 200° C. to 450° C. to bond the substrate 24 to the glass cell 22. The preferred temperature value is approximately 425° C. Additionally, there is shown a power supply 28 positioned between the first electrode 26a and a second electrode 26b. The power supply 28 is turned on to apply voltage across the glass cell 22 and the substrate 24 to initiate and complete the formation of the bond between the glass cell 22 and the substrate 24. The voltage applied is preferably in the range of 200V to 2KV with a preferred voltage value of about 1 KV. The voltage is applied for the duration preferably in the range of 10 seconds to 15 minutes. Also, as shown in FIG. 2, the electrode 26b is supported preferably on a thermal and electrical insulator block 29 to provide thermal insulation between the heater, i.e. electrodes 26a and 26b, and a base or table (not shown) where the bonding apparatus is positioned.

Finally, the power supply 28 is turned off and the first and the second electrodes 26a and 26b are removed to cool down to room temperature resulting in a fabricated UHV cell. The UHV cell includes a glass cell body or tubing with a substrate 24 having silicon.

It is to be noted that the anodic bonding described above is preferably performed in an inert gas atmosphere. The inert gases are preferably nitrogen or argon. In one of the embodiments the substrate 24 has a metal coating or layer on the surface that is exposed to the opening or cavity 23. The metal coating can be silver, copper, gold, platinum. The metal coating are usually deposited by evaporation or sputtering, processes very well known in the art. Silver and copper oxidize in air when the substrate 24 is being heated to the anodic bonding temperatures ranging from 200° C. to 450° C. The inert atmosphere or gas minimizes the oxidation of these metals. In this embodiment, two approaches are preferably used to create the nitrogen atmosphere. First approach is through a glove box. In this approach, the bonding apparatus including the glass cell 22 and the substrate 24 are positioned inside a glove box (not shown) with an inert gas atmosphere such as a nitrogen or an argon. A glove box is a known term for the one skill in the art. It is simply an enclosure typically made of metal, fiberglass, Plexiglas, or plastic having a window. The box includes an atmosphere with very low moisture content inside the enclosure. The second approach is by purging the bonding interface 25 with an inert gas such as a nitrogen or an argon. In this approach, preferably nitrogen is delivered to the opening or cavity 23 by a small tubing inserted into the opening or cavity 23. The nitrogen purge is on before heating and until the sample has cooled down to room temperature. Other gases used for purging are argon and a mixture of nitrogen and a reducing gas such as hydrogen. The nitrogen and hydrogen mixture also provides a reducing atmosphere that further minimizes the oxidation of the metals such as silver and copper.

Prior to the anodic bonding process as described above, the surfaces have to be polished and cleaned, especially the glass surface. Both surfaces, the glass cell 22 and the substrate 24, are lapped, polished and cleaned before bonding. First the surfaces are lapped to remove large irregularities or defects on the surfaces by removing large amounts of material. This is accomplished by positioning a pad (not shown) with lapping compound on top of a turntable that is part of a lapping and polishing machine. Next the surfaces are polished. Polishing is finalized by preferably a 1 μm diamond polish over a hard surface such as a tin pad (not shown), followed by a 3 μm cerium oxide polish over a soft pad (not shown).

Figure 3:
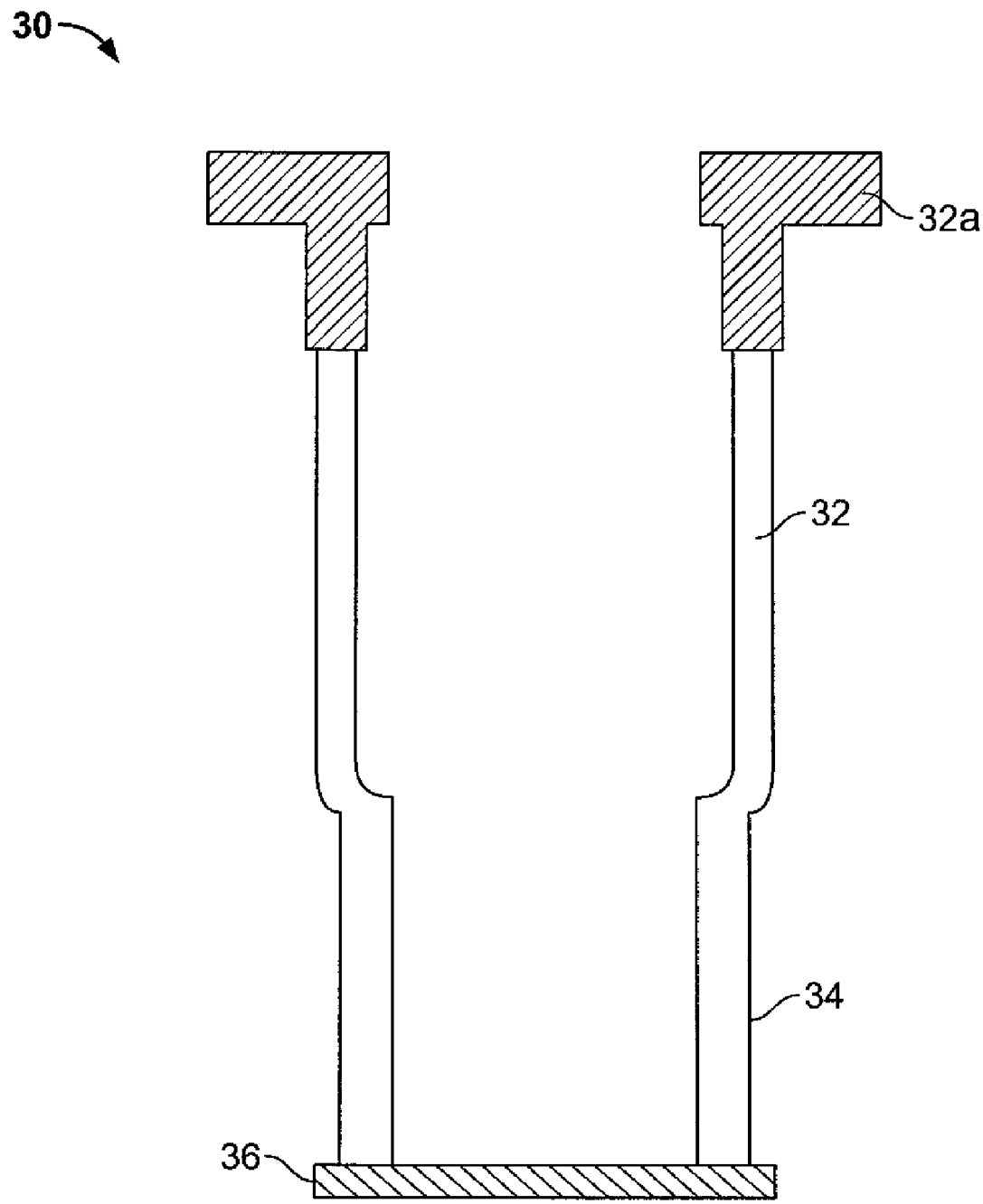
FIG. 3 illustrates a perspective view of an ultra-high-vacuum cell.

A UHV cell 30 consists of a body 32 including an optical quality cell 34 and a "chip" or substrate 36, as shown in FIG. 3. The body 32 is a chamber made of glass that is preferably attached to a glass/metal transition with a vacuum flange 32a as shown, for connection to external vacuum pump components. The optical quality cell 34 is also made of glass and is attached to the body by known glass blowing techniques. The "chip" 36 is a component located at one end of the cell 30 that could be mirror or an "atom" chip used for atom cooling applications.

Figure 4A:
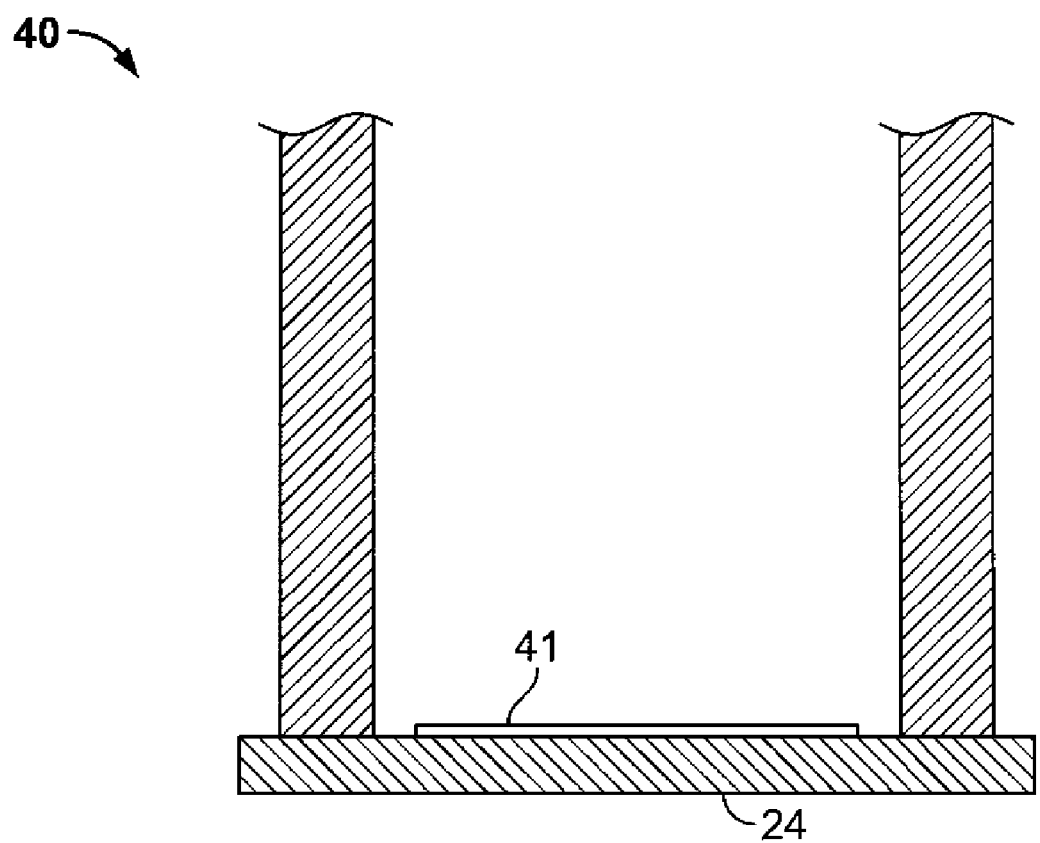
FIG. 4A illustrates a perspective view of a silicon "chip" according to another embodiment of the present invention.
Figure 4B:
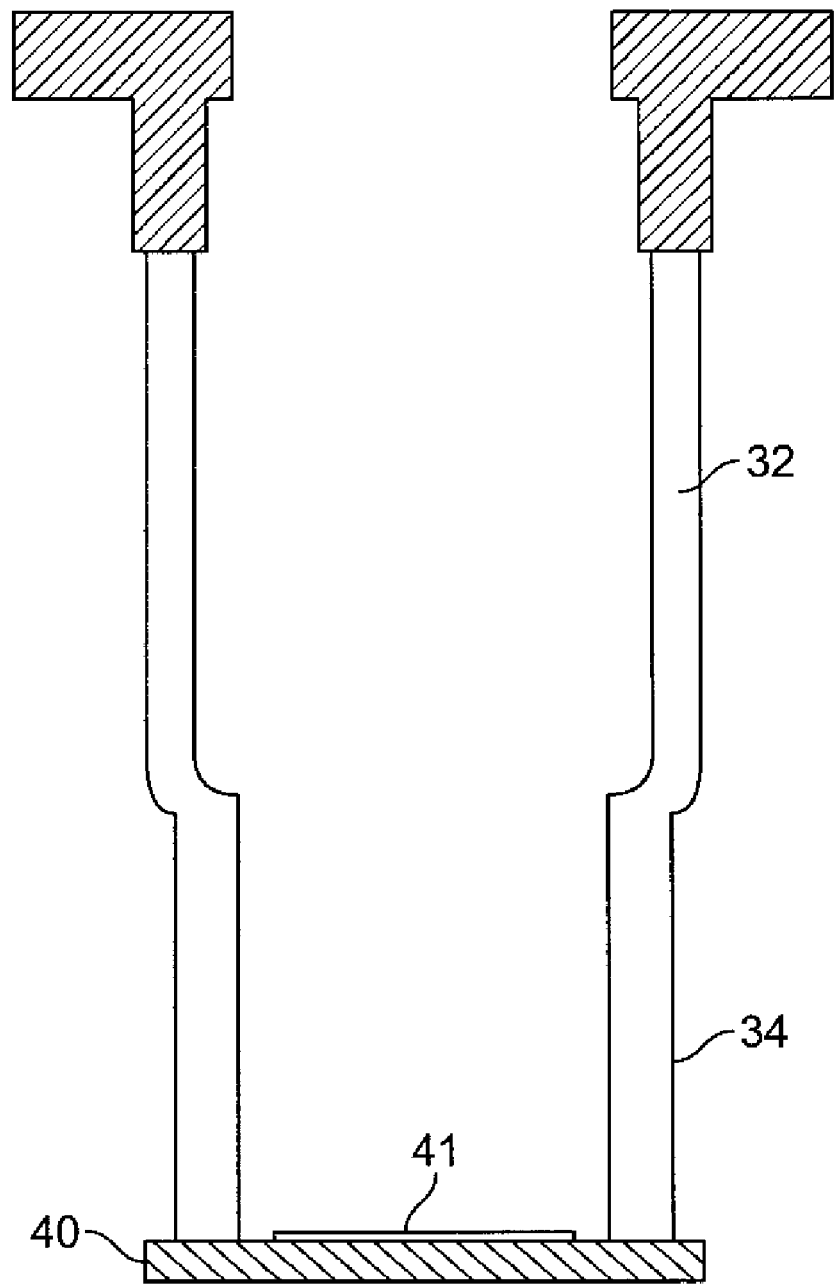
FIG. 4B illustrates a perspective view of the ultra-high-vacuum cell fabricated by anodic bonding of the silicon "chip" of FIG. 4A.

A major advantage of the approach of the anodic bonding as described with respect to FIG. 2A, is the elimination of epoxies and other adhesives in the cell fabrication. In current state of the art, the substrate 24 in FIG. 2 is attached to glass cell 22 by an epoxy or adhesive such as EPO-TEK 930-4 The approach of anodic bonding allows for baking at higher temperatures to attain better vacuum pressures, i.e. pressures better than $10^{-10}$ torr. After the vacuum cell has been fabricated and attached to a vacuum system, standard vacuum processing techniques require that the vacuum cell be subjected to high baking temperatures such as 300° C. or higher. Current state of art vacuum cells with epoxy or adhesives can not stand these high baking temperatures without the risk of catastrophic damage. Furthermore epoxies and adhesives release bi-products when heated that are detrimental to the vacuum system, acting as contaminants. The current invention allows baking temperatures as high as the temperatures used in the anodic bonding process, preferably at 425° C., and there is no release of bi-product or contaminants In another embodiment of the present invention, the substrate 24 is a silicon chip with metal coating 41, thus a silicon chip mirror 40 as shown in FIG. 4A. The metal coating 41 can preferably be silver, gold, platinum, copper, nickel, titanium, rhodium or multi-layer combinations of these metals. The metal coatings are deposited by conventional methods such as evaporation or sputtering. Now referring to FIG. 4B, there is shown the cell 30 fabricated by the anodic bonding of the silicon chip mirror 40 and the optical quality cell 34 of the glass tubing body 32. It is noted that the anodic bonding process is described above with reference to FIG. 2 above.

Figure 5A:
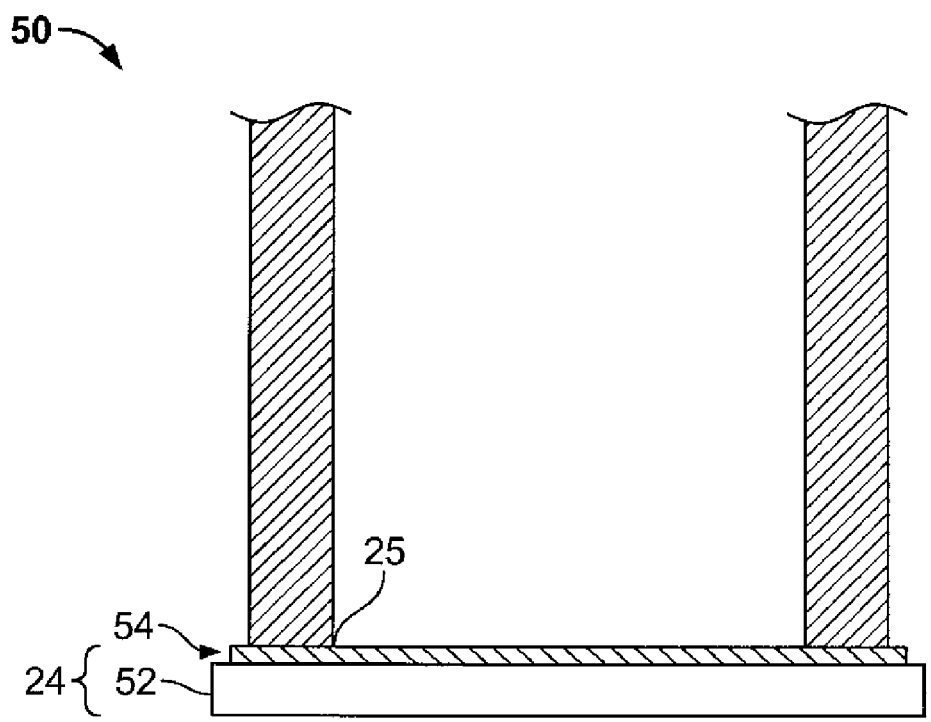
FIG. 5A, FIG. 5B, FIG. 5C and FIG. 5D illustrate a sectional view of an anodic bonding structure according to an alternate embodiment of the present invention.
Figure 5B:
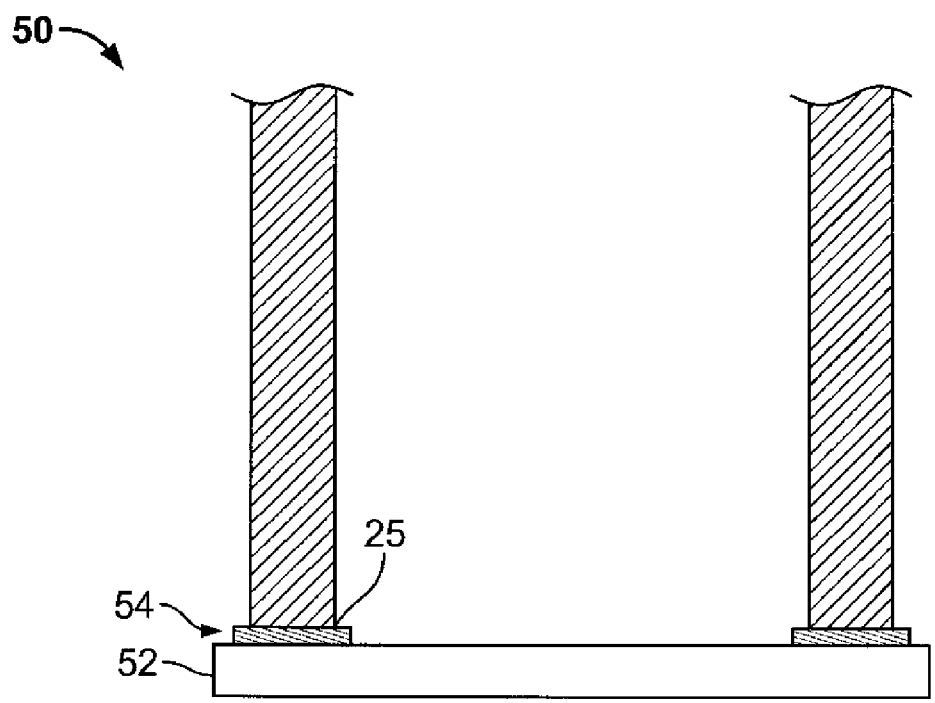
Figure 5C:
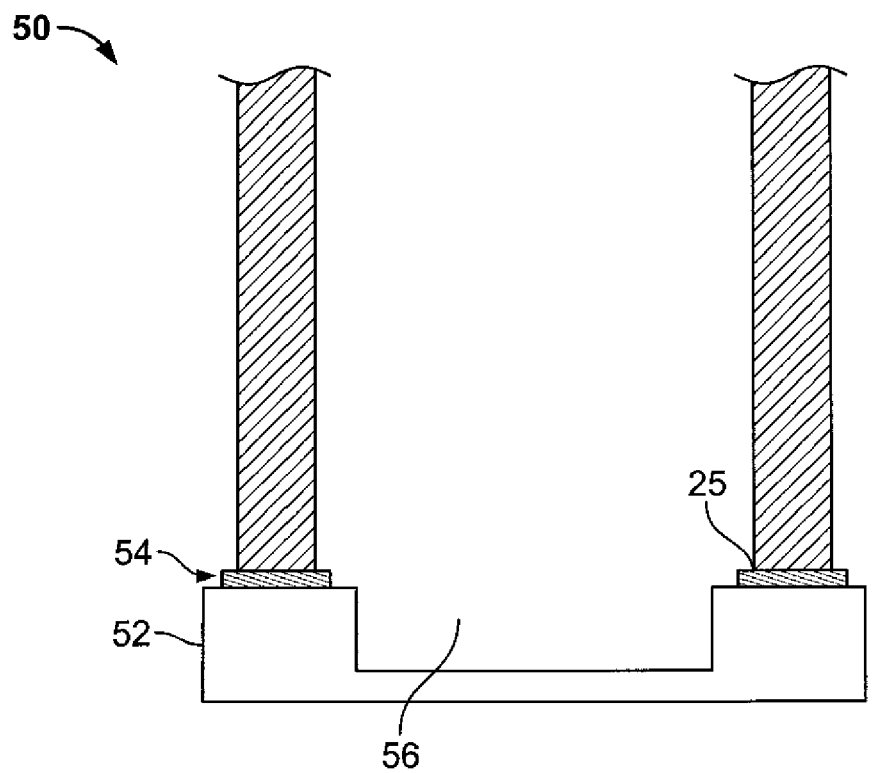
Figure 5D:
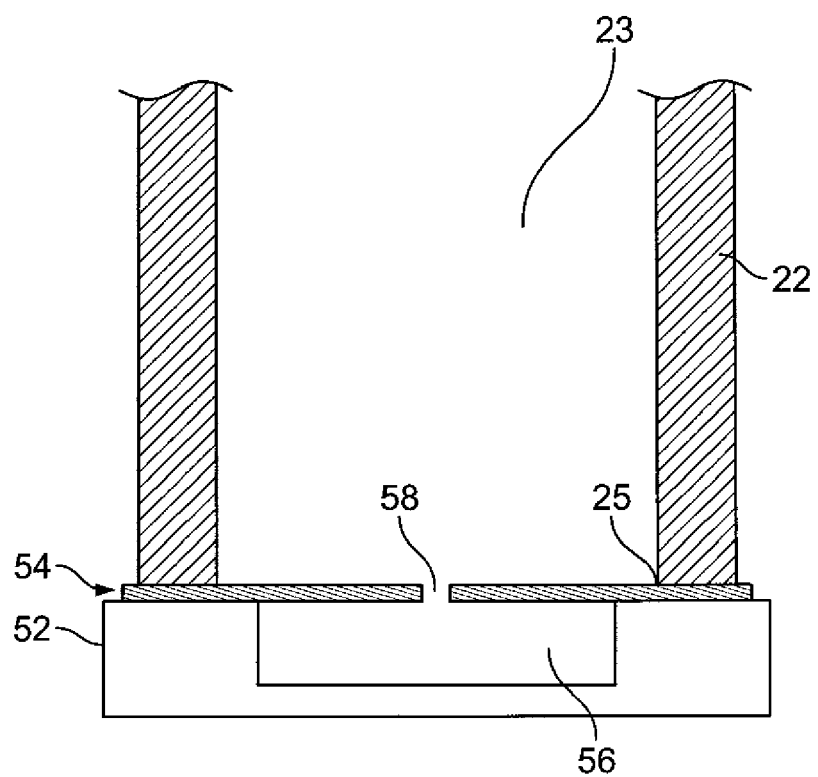

Now referring to FIGS. 5A, 5B, 5C and 5D of the present invention, there is shown a sectional view of a final fabricated cell 50 in accordance with further embodiment of the present invention. The cell 50 is constructed via the anodic bonding described with reference to FIG. 2 above. The cell 50 comprises the cell body 22 bonded on the substrate 24. The substrate 24 comprises a secondary layer substrate 52 with a silicon layer 54 secured on top of the secondary layer substrate 52. The silicon layer 54 can preferably be placed approximately on the entire secondary substrate 52, thereby substantially covering a top surface of the secondary substrate as shown in FIG. 5A. Alternatively, the silicon layer 54 is placed only at a portion of the secondary substrate 52 with the bonding interface 25 as shown in FIG. 5B. Preferably, the secondary layer substrate 52 comprises a cavity or volume 56 below the bonding surface 25 as shown in FIG. 5C. The purpose of the cavity 56 is to applied with respect to a dual cavity cell as described in a preferred embodiment with respect to FIG. 5D of the present invention. As shown in FIG. 5D, the layer 54 separates the cavity 56 of the secondary layer substrate 52 from the cavity 23 of the glass cell body 22. Also, shown is the layer 54 is an aperture 58 to combine or connect the two cavities 56 and 23 together. With this type of structure, two different processes can occur separately in the two cavities 56 and 23, however if needed, one process can be combined with the other via the aperture 58. For example, an alkali metal can be in the cavity 23 which can be later moved into cavity 56 to be free of any contaminants or vice versa.

The secondary layer substrate 52 is preferably made of glass, aluminum nitride, silicon nitride, silicon carbide, III-IV compounds such as GaAs and combinations thereof. The silicon layer 54 is preferably a crystalline silicon bonded to the secondary layer substrate 52 using the same anodic bonding process as described in FIG. 2A above. Alternatively, the silicon layer 54 is an amorphous silicon or polycrystalline silicon deposited on top of secondary layer substrate 52 by well-known chemical vapor deposition (CVD) processes.

The fabrication of the UHV cell with the anodic bonding technique of the present invention can be applied to various scientific areas such as Atomic and Molecular Physics, Laser Cooling, Magneto-Optical Trap (MOT), Bose-Einstein Condensate (BEC) and other related areas. The present invention can also be applied to applications such as Atomic Clocks, Atom Interferometers, Atom Gyroscopes, Quantum Computing and other related technologies.

Although various embodiments that incorporate the teachings of the present invention have been shown and described in detail herein, those skilled in the art can readily devise many other varied embodiments that still incorporate these teachings without departing from the spirit and the scope of the invention.

What is claimed is:

1. A method for fabricating a vacuum glass cell using anodic bonding technique, in which a body of the cell is bonded onto a substrate at a cavity or opening of the cell, the method comprising the steps of:
   positioning the substrate on a first electrode;
   aligning the body of the cell on top of the substrate, thereby enclosing said cavity to form a bonding interface, said interface having silicon;
   applying pressure to hold the cell on the substrate;
   attaching a second electrode around the body of the cell;
   heating said substrate and said cell body via said at least one of the first and second electrodes;
   applying voltage between said first and second electrodes to initiate and complete formation of the bond between the cell and the substrate.

2. The method of claim 1 further comprising baking said bonded substrate and the cell.

3. The method of claim 1 further comprising applying a gas to said bonding interface, said gas comprising an inert gas, reducing gas, and combinations thereof.

4. The method of claim 1 wherein heating is performed in the range from about 200° C. to about 450° C. without a release of by-product or contamination.

5. The method of claim 1 wherein said voltage is applied in the range from about 200V to about 2KV.

6. The method of claim 1 further comprising enclosing said cell and the substrate with a gas, said gas comprising an inert gas, reducing gas, and combinations thereof.

7. The method of claim 1 wherein said cavity comprising an alkali metal.

8. The method of claim 1 wherein said substrate comprising an optical component.

9. The method of claim 1 wherein said substrate comprising a silicon layer and a secondary substrate.

10. The method of claim 9 wherein said secondary substrate comprising a cavity below the bonding interface.

11. The method of claim 9 further comprising placing said silicon layer on top of the secondary substrate to substantially cover the top surface of the secondary substrate.

12. The method of claim 9 further comprising placing said silicon layer only at a portion of the secondary substrate with the bonding interface.

* * * * *